(12) United States Patent
Kin

(10) Patent No.: US 8,508,889 B2
(45) Date of Patent: Aug. 13, 2013

(54) ELECTRICAL CONNECTION STRUCTURE FOR PIEZOELECTRIC ELEMENT AND HEAD SUSPENSION

(75) Inventor: Tatsuhiro Kin, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 56 days.

(21) Appl. No.: 13/081,321

(22) Filed: Apr. 6, 2011

(65) Prior Publication Data

US 2011/0279929 A1 Nov. 17, 2011

(30) Foreign Application Priority Data

May 12, 2010 (JP) ................ P2010-110691

(51) Int. Cl.
*G11B 5/55* (2006.01)
*G11B 21/08* (2006.01)
*G11B 5/56* (2006.01)
*G11B 21/24* (2006.01)

(52) U.S. Cl.
USPC ..................... 360/264.2; 360/294.4

(58) Field of Classification Search
USPC .......... 360/99.25, 264.2, 266.3, 271.9, 281.7, 360/291.9, 292, 294.3, 294.4, 244.5, 245.8
See application file for complete search history.

(56) References Cited

U.S. PATENT DOCUMENTS

| | | | | |
|---|---|---|---|---|
| 5,929,511 | A * | 7/1999 | Nakazawa et al. | 257/666 |
| 5,961,334 | A * | 10/1999 | Inaba | 439/67 |
| 8,317,081 | B2 * | 11/2012 | Ogaki et al. | 228/262.42 |
| 2002/0089793 | A1 * | 7/2002 | Nakagawa et al. | 360/294.4 |
| 2004/0113260 | A1 * | 6/2004 | Sunohara et al. | 257/698 |
| 2006/0073639 | A1 * | 4/2006 | Sunohara et al. | 438/118 |
| 2008/0261079 | A1 * | 10/2008 | Masuda et al. | 428/811.2 |
| 2009/0086379 | A1 * | 4/2009 | Hanya et al. | 360/294.4 |
| 2009/0190263 | A1 * | 7/2009 | Miura et al. | 360/245.8 |
| 2010/0067151 | A1 * | 3/2010 | Okawara et al. | 360/294 |
| 2010/0073825 | A1 * | 3/2010 | Okawara | 360/294.4 |
| 2010/0165515 | A1 * | 7/2010 | Ando | 360/290 |

FOREIGN PATENT DOCUMENTS

JP 2002-050140 2/2002

* cited by examiner

*Primary Examiner* — Wayne Young
*Assistant Examiner* — Adam B Dravininkas
(74) *Attorney, Agent, or Firm* — Jordan and Hamburg LLP

(57) ABSTRACT

An electrical connection structure connects a piezoelectric element to a flexure with a conductive adhesive. An electrode surface is formed on the piezoelectric element, and a terminal surface is formed on the wiring member and is smoother than the electrode surface. A gold plate layer is formed on the terminal surface and is connected to the electrode surface with the conductive adhesive. At least one recess is formed by laser processing on the conductive terminal surface layer. The electrical connection structure substantially equalizes the surface roughness of the terminal surface with the gold plate layer to that of the electrode surface, improves a bonding strength on the terminal surface nearly to that on the electrode surface, enhances the reliability of electrical connection between the electrode surface and the terminal surface, maintains electrical characteristics of the terminal surface, and prevents contamination around the terminal surface.

6 Claims, 13 Drawing Sheets

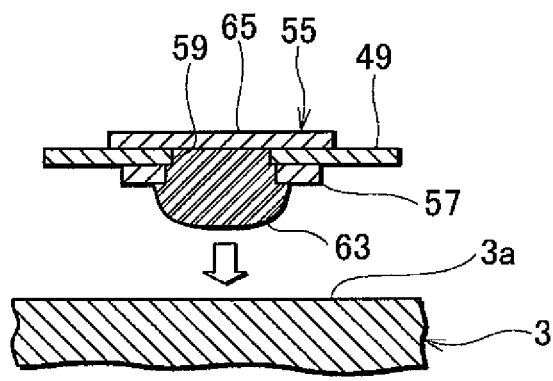
Fig.5A
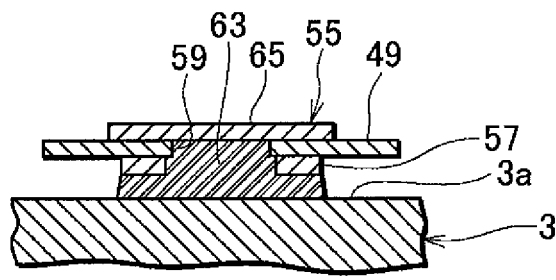
Fig.5B
Fig.6
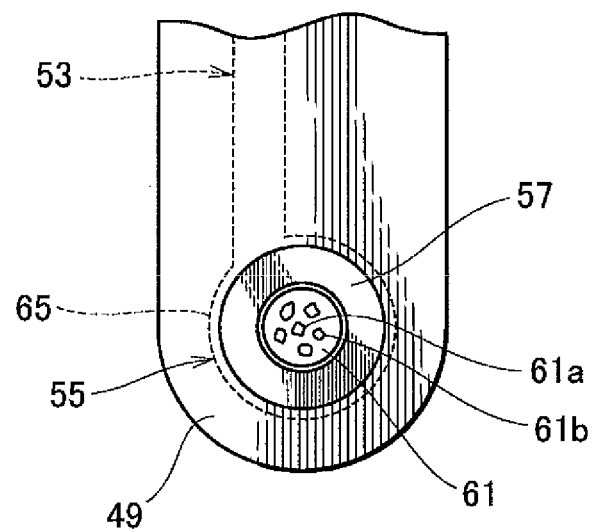

ELECTRICAL CONNECTION STRUCTURE FOR PIEZOELECTRIC ELEMENT AND HEAD SUSPENSION

BACKGROUND OF THE INVENTION

1. Field of the Invention

The present invention relates to an electrical connection structure between a piezoelectric element and a wiring member, as well as to a head suspension employing the electrical connection structure.

2. Description of Related Art

Small-sized precision information devices are rapidly advancing, and for use with such devices, needs for micro-actuators capable of conducting positioning control for very small distances are increasing. Such micro-actuators are highly needed by, for example, optical systems for correcting focuses and inclination angles, ink jet printers for controlling ink heads, and magnetic disk drives for controlling magnetic heads.

The magnetic disk drives increase storage capacities by increasing the number of tracks per inch (TPI), i.e., by narrowing the width of each track on a magnetic disk.

The magnetic disk drive, therefore, needs an actuator capable of precisely positioning the magnetic head within a minute range across tracks.

To meet the need, a head suspension with a dual actuator system is proposed in Japanese Unexamined Patent Application Publication No. 2002-50140. The dual actuator system employs a piezoelectric element in addition to a usual voice coil motor that drives a carriage to which the head suspension is attached. The piezoelectric element is made of piezoelectric ceramics and is arranged between a base plate and a load beam of the head suspension. According to this related art, the voice coil motor turns the head suspension through the carriage, and in addition, the piezoelectric element deforms in proportion to a voltage applied thereto, to minutely move a magnetic head at a front end of the load beam in a sway direction (a widthwise direction of the load beam) relative to the base plate.

With the dual actuator system involving the voice coil motor and piezoelectric element, the related art is capable of precisely positioning the magnetic head to a target position on a magnetic disk.

The head suspension employing the dual actuator system connects an electrode surface of the piezoelectric element and a terminal surface of a wiring member to each other with a conductive adhesive.

To improve the electrical characteristics of connection between the piezoelectric element and the wiring member, the electrode surface of the piezoelectric element is made by plating gold and the terminal surface of the wiring member is covered with a gold plate layer. The gold plate layer has a thickness in the range of about 0.1 to 5.0 μm, for example, a thickness of about 0.5 μm. The gold-plated electrode surface and the gold plate layer on the terminal surface are bonded together with a conductive adhesive.

This technique seems to achieve same bonding conditions on the electrode surface of the piezoelectric element and the terminal surface of the wiring member.

However, a peeling test to peel off the electrode surface of the piezoelectric element and the terminal surface of the wiring member from each other shows that the conductive adhesive is entirely peeled off from the terminal surface of the wiring member and is left on the electrode surface of the piezoelectric element, instead of being broken and separated evenly to the terminal surface and electrode surface.

This means that the original bonding strength of the conductive adhesive is not fully used to bond the terminal surface and electrode surface together, and therefore, the reliability of electrical connection between them is dubious.

FIG. 26 is a photograph showing the terminal surface of the wiring member after the peeling test and FIG. 27 is a photograph showing the electrode surface of the piezoelectric element after the peeling test.

After the peeling test, the terminal surface of the terminal 103 of the wiring member (flexure) 101 clearly exposes the gold plate layer 105 as seen in FIG. 26 and the conductive adhesive 109 remains only on the electrode surface 107a of the piezoelectric element 107 as seen in FIG. 27.

The inventors of the present invention have studied a cause of the conductive adhesive being entirely left on the electrode surface 107a of the piezoelectric element 107, although the terminal surface of the terminal 103 and the electrode surface 107a are similarly plated with gold.

The study has found that the surface texture of the piezoelectric element 107 made of the piezoelectric ceramics is the cause. Namely, the electrode surface 107a of the piezoelectric element 107 is rugged compared with the terminal surface of the terminal 103 of the flexure (wiring member) 101.

Due to this, a bonding strength on the electrode surface 107a of the piezoelectric element 107 plated with gold is stronger than that on the terminal surface of the terminal 103 of the flexure 101 also plated with gold.

To make the surface roughness of the terminal surface of the terminal 103 similar to that of the electrode surface 107a, the terminal surface of the terminal 103 may be processed or scratched with a tool. This, however, deteriorates the electrical characteristics of the terminal 103 or contaminates the terminal 103.

SUMMARY OF THE INVENTION

An object of the present invention is to provide an electrical connection structure for electrically connecting an electrode surface of a piezoelectric element and a terminal surface of a wiring member to each other, capable of improving the reliability of electrical connection between the electrode surface and the terminal surface without deteriorating electrical characteristics of the terminal or without contaminating the terminal. Another object of the present invention is to provide a head suspension employing the electrical connection structure.

In order to accomplish the object, a first aspect of the present invention provides an electrical connection structure for connecting a piezoelectric element and a wiring member to each other with a conductive adhesive. The electrical connection structure includes an electrode surface formed on the piezoelectric element and a terminal surface formed on the wiring member and being smoother than the electrode surface. A conductive terminal surface layer is formed on the terminal surface and is connected to the electrode surface with the conductive adhesive. At least one recess is formed by laser processing on the conductive terminal surface layer.

A second aspect of the present invention provides a head suspension employing the electrical connection structure of the first aspect. The head suspension includes a base and a load beam connected to the base, a read-write head attached to the load beam, and a piezoelectric element employing the electrical connection structure. The piezoelectric element is arranged between the base and the load beam and is configured to deform in proportion to a voltage applied thereto, to minutely move the read-write head through the load beam in a sway direction relative to the base.

According to the first aspect, one or more recesses formed on the conductive terminal surface layer make the surface roughness of the terminal surface closer or equal to that of the electrode surface of the piezoelectric element. This improves a bonding strength on the terminal surface relative to that on the electrode surface, thereby improving the reliability of electrical connection between the electrode surface and the terminal surface.

Since the recesses are formed on the conductive terminal surface layer, the terminal surface under the conductive terminal surface layer is free from the influence of the recesses, thereby keeping its original electrical characteristics.

The recesses on the conductive terminal surface layer are formed by laser processing, and therefore, no contamination occurs around the terminal.

According to the second aspect, the improved electrical connection and maintained electrical characteristics between the electrode surface of the piezoelectric element and the terminal surface of the wiring member surely apply a voltage to the piezoelectric element and reliably move the magnetic head relative to the base for a very short distance in a sway direction.

BRIEF DESCRIPTION OF THE DRAWINGS

FIGS. 5A and 5B are sectional views taken along a line V-V of FIG. 1, in which FIG. 5A illustrates a piezoelectric element and a terminal before connection and FIG. 5B illustrates the same after connection;

FIG. 6 is an enlarged plan view illustrating recesses formed on a gold plate layer on the terminal;

DETAILED DESCRIPTION OF EMBODIMENTS

An embodiment of the present invention will be explained with reference to the drawings. The embodiment forms one or more recesses by laser processing on a conductive terminal surface layer formed on a terminal surface of a head suspension, to improve the reliability of electrical connection between the terminal surface and an electrode surface of a piezoelectric element of the head suspension, maintain the electrical characteristics of the terminal, and prevent contamination of the terminal.

Figure 1:
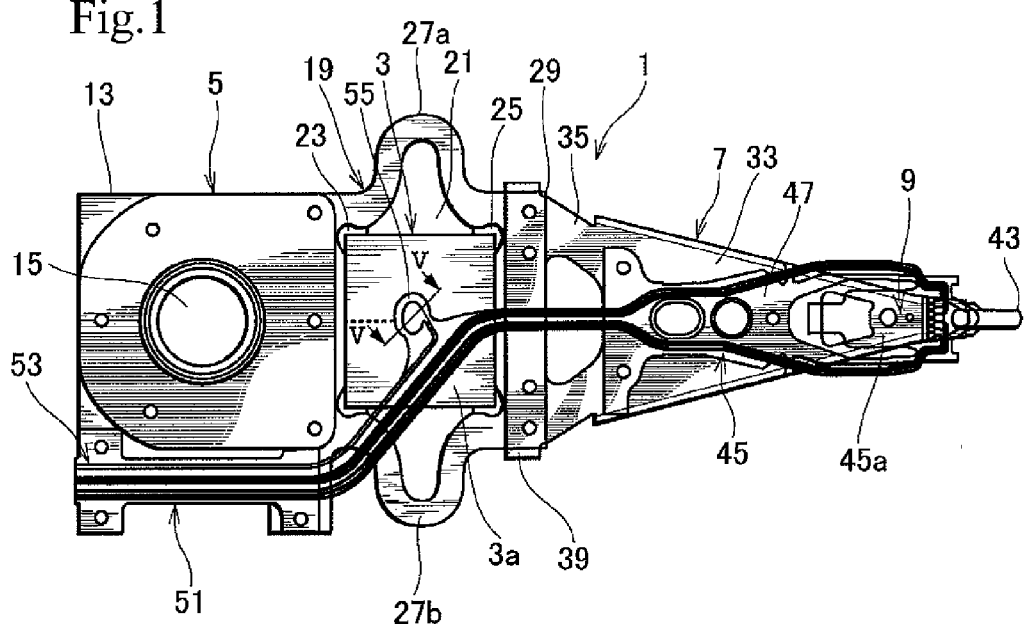
FIG. 1 is a plan view illustrating a head suspension according to an embodiment of the present invention.
Figure 2:
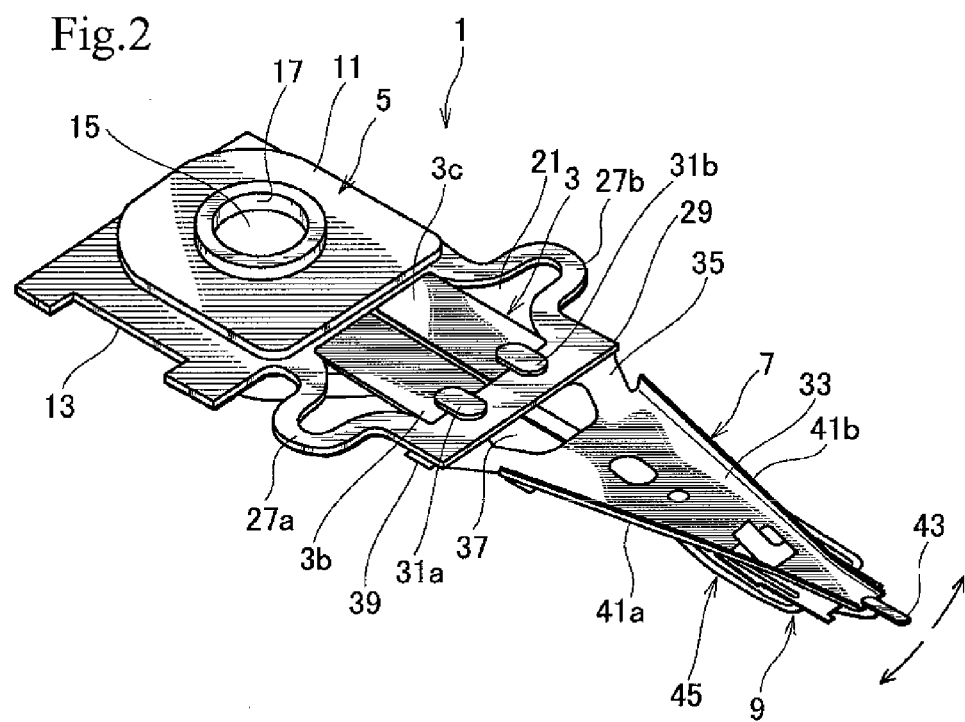
FIG. 2 is a perspective view illustrating the head suspension of FIG. 1.

FIG. 1 is a plan view illustrating a head suspension 1 according to an embodiment of the present invention and FIG. 2 is a perspective view illustrating the same.

As illustrated in FIGS. 1 and 2, the head suspension 1 includes a piezoelectric element 3 for which an electrical connection structure according to an embodiment of the present invention is applied, a base 5, a load beam 7 attached to the base 5, and a read-write head 9 attached to a front end of the load beam 7.

The piezoelectric element 3 has a rectangular shape and is made of piezoelectric ceramics such as PZT (lead zirconate titanate). The piezoelectric element 3 is provided with a common electrode surface 3a made by plating gold on a first surface thereof and a pair of electrode surfaces 3b and 3c made by plating gold on a second surface thereof. Thus, electrode surfaces 3a, 3b and 3c are formed on the piezoelectric element 3.

The piezoelectric element 3 is arranged between the base 5 and the load beam 7 and is configured to deform in proportion to a voltage applied thereto, to minutely move the read-write head 9 through the load beam 7 in a sway direction (widthwise direction of the load beam 7) relative to the base 5.

The base 5 includes a base plate 11 made of conductive material such as stainless steel and a reinforcing plate 13 made of conductive material such as stainless steel. A base end part of the reinforcing plate 13 is laid on the base plate 11 and joined thereto by, for example, laser welding. A through hole 15 is formed through both the base plate 11 and reinforcing plate 13. The base plate 11 has an integral boss 17 that is fitted to a hole of a carriage (not illustrated) by swaging, the carriage being attached to a voice coil motor (not illustrated). The voice coil motor is driven to turn the carriage so as to turn the head suspension 1.

A front end part of the reinforcing plate 13 serves as a fitting part 19 for the piezoelectric element 3. The fitting part 19 has an opening 21 in which the piezoelectric element 3 is arranged. The opening 21 includes receivers 23 and 25 formed by etching the fitting part 19. To the receivers 23 and 25, the piezoelectric element 3 is fixed with a nonconductive adhesive. On each side of the opening 21 in a sway direction, there are flexible parts 27a and 27b.

A front end of the fitting part 19 is a fixing part 29 to which the load beam 7 is fixed. Between the fixing part 29 and the electrode surfaces 3b and 3c of the piezoelectric element 3, conductive adhesives 31a and 31b are applied to electrically connect the electrode surfaces 3b and 3c to the reinforcing plate 13.

The load beam 7 applies load onto the read-write head 9 attached to the front end of the load beam 7. The load beam 7 is made of, for example, a stainless steel thin plate and includes a rigid part 33 and a resilient part 35.

The resilient part 35 is branched by a window 37, to reduce bending rigidity in a thickness direction. A base end of the resilient part 35 is a fixing part 39 that is fixed to the fixing part 29 of the base 5 by, for example, laser welding.

Along each edge of the rigid part 33, bends 41a and 41b are formed in a thickness direction by box-bending. The bends 41a and 41b extend between front and base ends of the rigid part 33.

The front end of the rigid part 33 is provided with a load-unload tab 43 and a dimple (not illustrated).

The read-write head 9 has a slider that is supported by a tongue 45a of a flexure 45 as a wiring member. The flexure 45 longitudinally extends along the load beam 7 and base 5 and is attached to the load beam 7.

Figure 3:
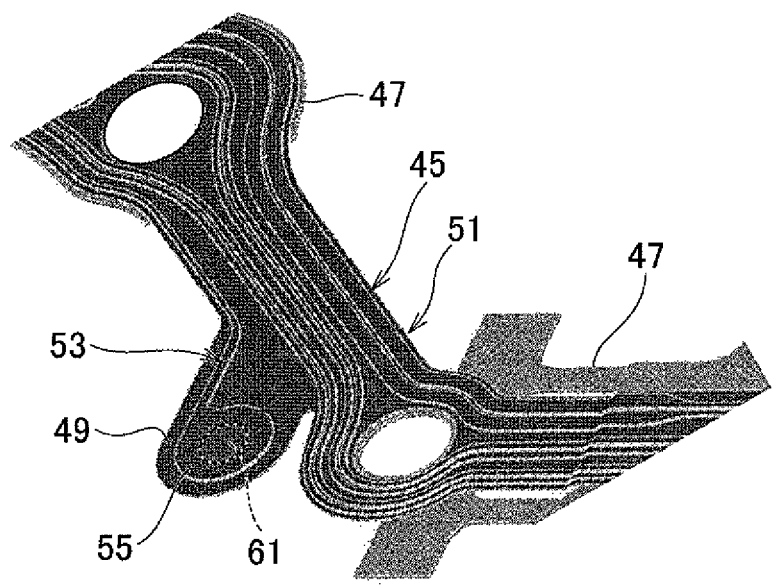
FIG. 3 is a perspective view illustrating part of a flexure of the head suspension of FIG. 1.
Figure 4:
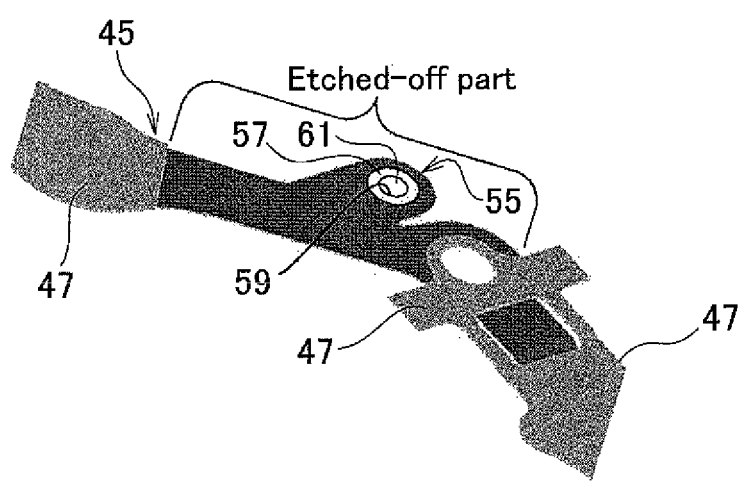
FIG. 4 is a perspective view illustrating part of the flexure of FIG. 3 seen from the opposite side.

FIG. 3 is a perspective view illustrating part of the flexure 45 and FIG. 4 is a perspective view illustrating part of the opposite side of the flexure 45. Although the flexure 45 illustrated in FIGS. 3 and 4 is different in shape from that illustrated in FIGS. 1 and 2, the flexure 45 of FIGS. 3 and 4 is the same flexure as that of FIGS. 1 and 2.

The flexure 45 includes a conductive thin plate 47 such as a resilient thin stainless steel rolled plate (SST), an insulating layer 49 formed on the thin plate 47, and copper wiring patterns 51 and 53 as wires formed on the insulating layer 49. The conductive thin plate 47 has a thickness in the range of about 10 to 25 µm, and according to the embodiment, the thickness is about 18 µm. The copper wiring patterns 51 and 53 have a thickness in the range of about 5 to 15 µm, and according to the embodiment, the thickness is about 9 µm.

An end of the wiring pattern 51 is electrically connected to read and write terminals of the read-write head 9 supported by the slider. At an end of the wiring pattern 53, a terminal 55 is formed.

FIGS. 5A and 5B are sectional views taken along a line V-V of FIG. 1, in which FIG. 5A illustrates the piezoelectric element 3 and terminal 55 before connection and FIG. 5B illustrates the same after connection.

As illustrated in FIGS. 3 to 5B, the conductive thin plate 47 is etched off around the terminal 55, to leave a ring 57. Namely, the ring 57 is made from the conductive thin plate 47 that is made of, for example, a resilient thin stainless steel rolled plate (SST).

At the terminal 55, the insulating layer 49 has a circular window 59 to expose a gold plate layer 61 to the electrode surface 3a of the piezoelectric element 3. The gold plate layer 61 is formed by plating gold on the terminal 55 and serves as a conductive terminal surface layer.

As illustrated in FIG. 5A, a conductive adhesive 63 such as silver paste is filled in the window 59 and ring 57 and is attached to the electrode surface 3a of the piezoelectric element 3 as illustrated in FIG. 5B.

At this time, the ring 57 functions as a stopper to stop the conductive adhesive 63, which is liquid when applied, from oozing out of the periphery of the ring 57 around the window 59 opposite to the terminal surface 65a. The conductive adhesive 63 enters a narrow space between the ring 57 and the electrode surface 3a due to a capillary phenomenon and solidifies at there as illustrated in FIG. 5B.

The ring 57 improves bonding strength between the terminal 55 and the piezoelectric element 3. The ring 57 and recesses 61a, 61b, and the like (to be explained later) of the gold plate layer 61 cooperate to synergistically improve the bonding strength.

The piezoelectric element 3 deforms in proportion to voltages applied to the electrode surfaces 3a, 3b, and 3c, to minutely move the read-write head 9 through the load beam 7 in a sway direction relative to the base 5.

The base 5 is turned by the voice coil motor (not illustrated) through the carriage (not illustrated).

Figure 7:
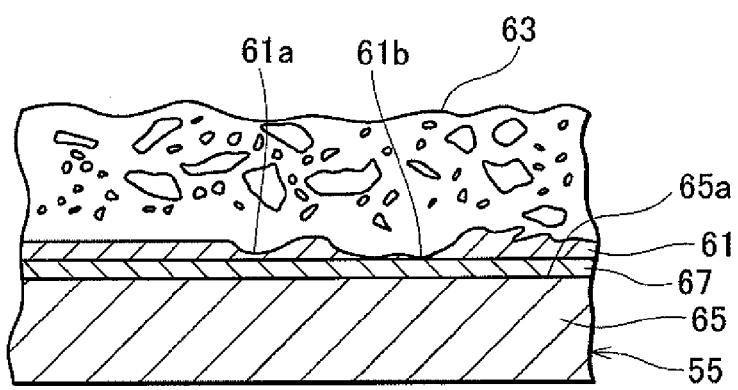
FIG. 7 is an enlarged schematic sectional view illustrating the recesses of FIG. 6.

The recesses 61a, 61b, and the like will be explained with reference to FIGS. 6 and 7 in which FIG. 6 is an enlarged plan view illustrating the recesses formed on the gold plate layer 61 on the terminal 55 and FIG. 7 is an enlarged schematic sectional view illustrating the recesses on the gold plate layer 61.

As illustrated in FIGS. 6 and 7, the terminal 55 has a copper terminal body 65 integrated with the end of the wiring pattern 53. The terminal body 65 has a terminal surface 65a. Thus, the terminal surface 65a is formed on the flexure 45 as the wiring member. On the terminal surface 65a, a nickel plate layer 67 is formed by plating nickel on the terminal surface 65a. The nickel plate layer 67 serves as an intermediate layer. On the nickel plate layer 67, the gold plate layer 61 is formed by plating gold on the layer 67. Thus, the gold plate layer 61 as the conductive terminal surface layer is formed on the terminal surface 65a. The thickness of the nickel plate layer 67 is in the range of about 0.05 to 3.0 µm, and according to the embodiment, is about 1.2 µm.

The nickel plate layer 67 is present between the terminal surface 65a and the gold plate layer 61, to prevent corrosion of the terminal surface 65a.

On the gold plate layer 61, recesses 61a, 61b, and the like are randomly formed by laser processing.

The recesses 61a, 61b, and the like on the gold plate layer 61 may partly expose the nickel plate layer 67. The laser processing to form the recesses, however, is carried out with the controlled laser power not to make the recesses reach the terminal surface 65a.

The gold-plated electrode surface 3a of the piezoelectric element 3 is rugged according to the surface texture of the piezoelectric element 3 that is made of ceramics such as PZT. Accordingly, the surface of the gold plate layer 61 formed on the terminal surface 65a is smoother than the gold-plated electrode surface 3a, if there are no recesses 61a, 61b, and the like on the gold plate layer 61.

Namely, the recesses 61a, 61b, and the like formed on the gold plate layer 61 make the surface roughness of the gold plate layer 61 on the terminal surface 65a closer or equal to that of the gold-plated electrode surface 3a of the piezoelectric element 3.

As mentioned above, the terminal 55 is fixed and adhered to the electrode surface 3a of the piezoelectric element 3 with the conductive adhesive 63. The conductive adhesive 63 fills the recesses 61a, 61b, and the like on the gold plate layer 61, to nearly equalize a bonding strength on the terminal surface 65a with the gold plate layer 61 to that on the electrode surface 3a.

Figure 8:
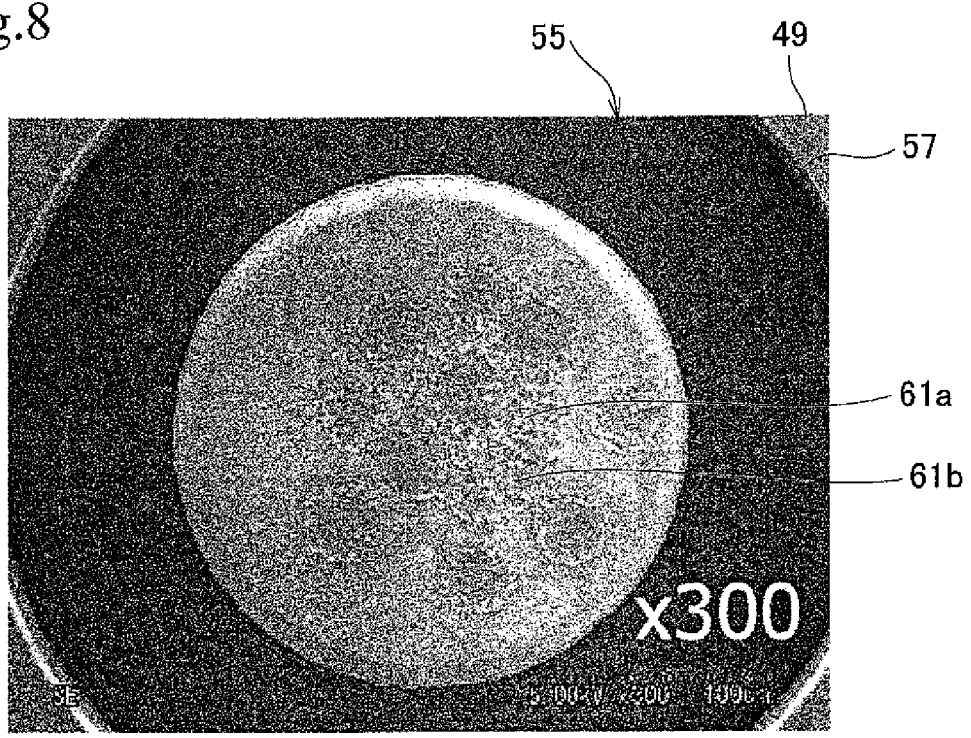
FIG. 8 is a plan photograph showing the recesses formed on the gold plate layer on the terminal.
Figure 9:
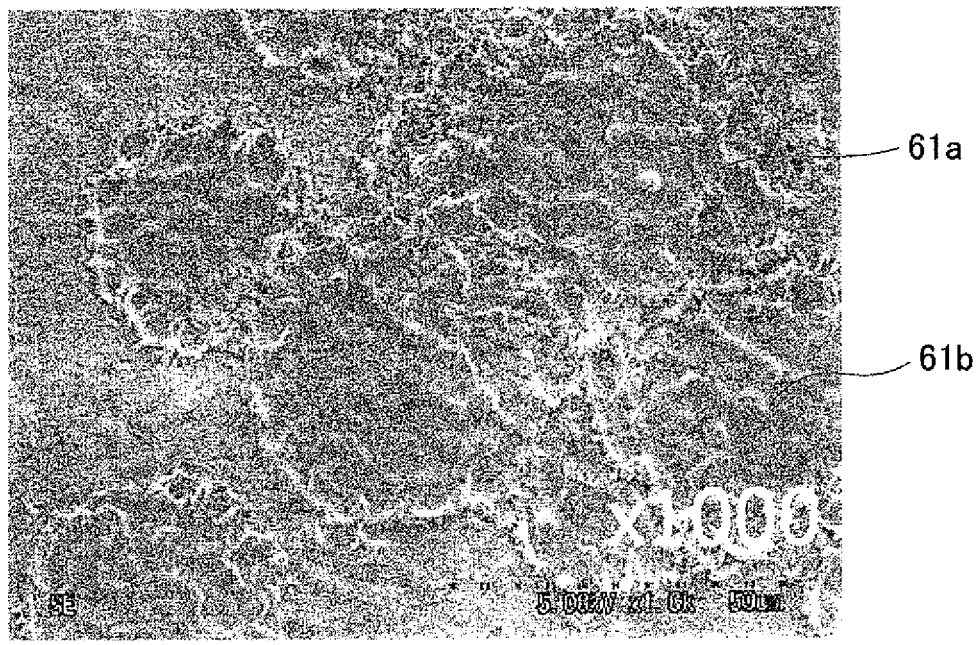
FIG. 9 is an enlarged plan photograph showing the recesses of FIG. 8.
Figure 10:
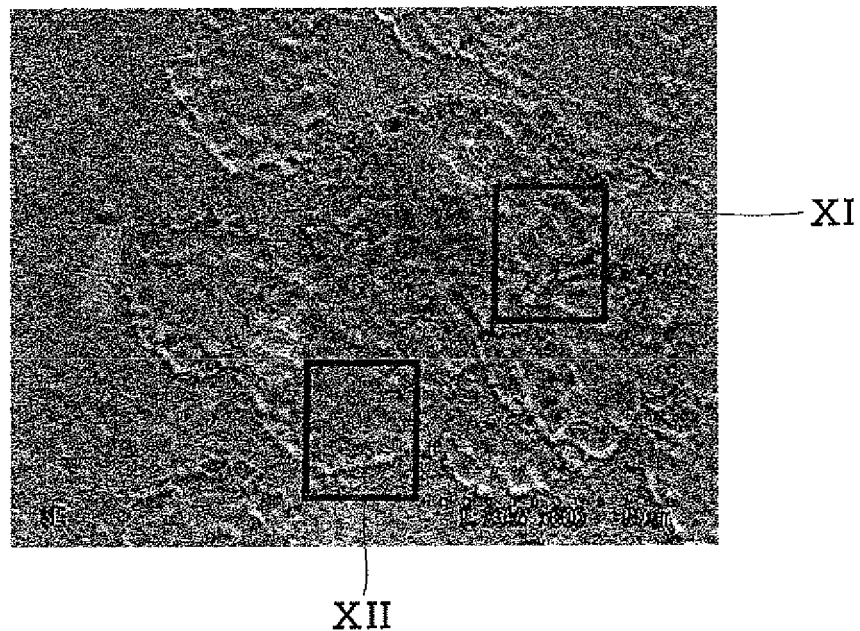
FIG. 10 is an enlarged plan photograph similar to FIG. 9, showing regions defined on the gold plate layer measured with a spectrophotometer.
Figure 11:
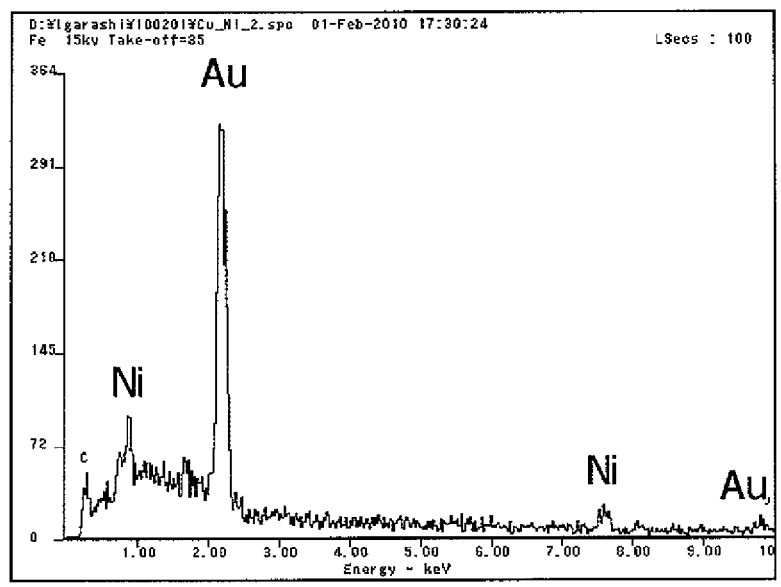
FIG. 11 is a graph illustrating a measurement result of the region XI of FIG. 10.
Figure 12:
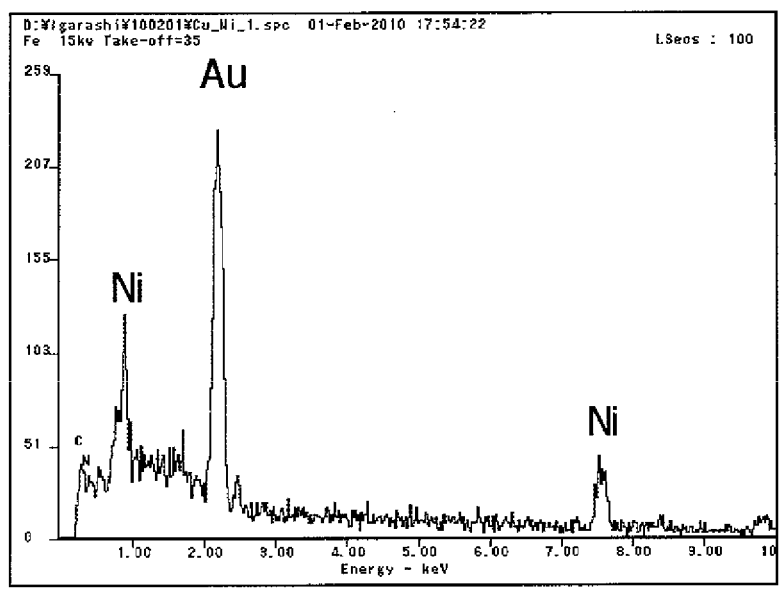
FIG. 12 is a graph illustrating a measurement result of the region XII of FIG. 10.

FIG. 8 is a plan photograph showing the recesses 61a, 61b, and the like formed on the gold plate layer 61 on the terminal 55, FIG. 9 is an enlarged plan photograph showing the recesses of FIG. 8, FIG. 10 is an enlarged plan photograph showing regions defined on the gold plate layer 61 measured with a spectrophotometer, FIG. 11 is a graph illustrating a measurement result of the region XI of FIG. 10, and FIG. 12 is a graph illustrating a measurement result of the region XII of FIG. 10.

As illustrated in FIGS. 8 and 9, the recesses 61a, 61b, and the like are formed on the gold plate layer 61 of the terminal 55 and the regions XI and XII (FIG. 10) defined on the gold plate layer 61 are measured with a spectrophotometer to analyze components of the regions XI and XII. As a result of the measurement, only gold and nickel are found and no copper is found as illustrated in FIGS. 11 and 12. This means that the laser processing to form the recesses 61a, 61b, and the like on the gold plate layer 61 does not expose the terminal surface 65a.

Figure 13:
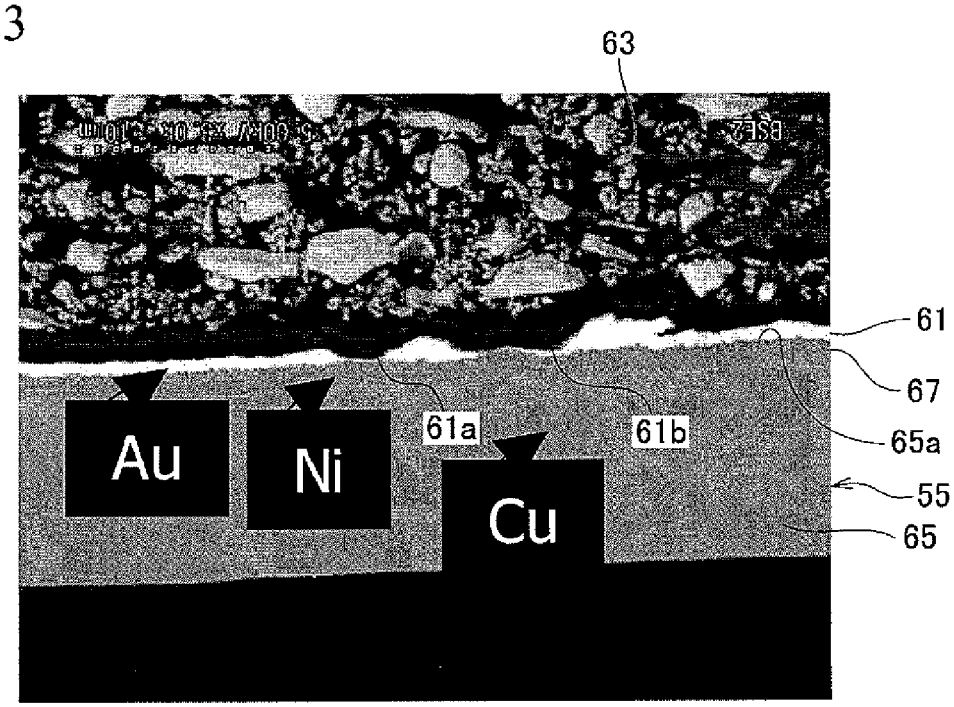
FIG. 13 is an enlarged sectional photograph showing the recesses formed on the gold plate layer on the terminal.
Figure 14:
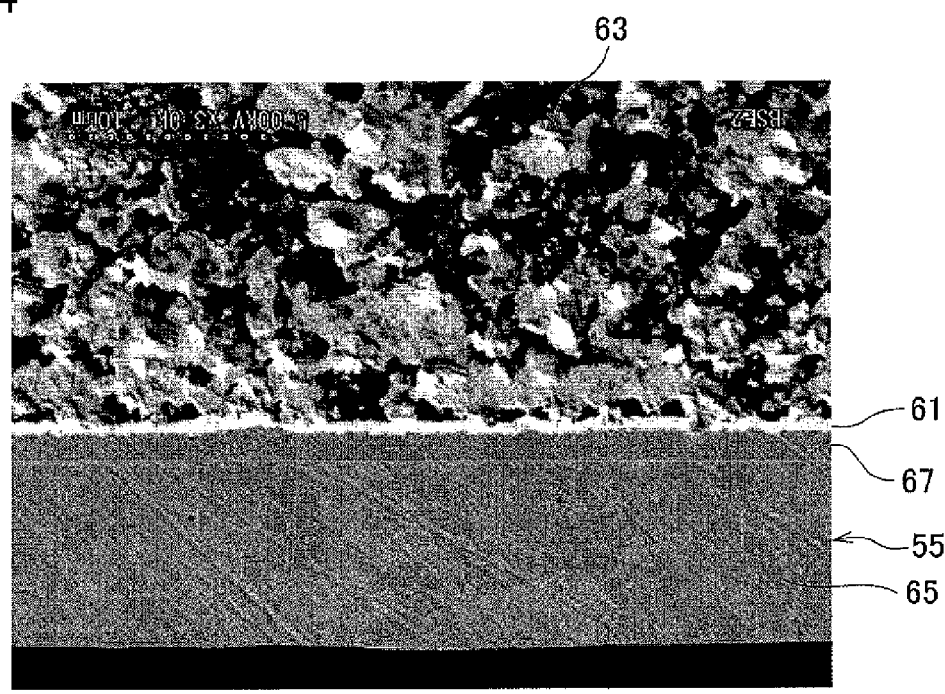
FIG. 14 is an enlarged sectional photograph showing a gold plate layer without recesses according to a comparative example.

FIG. 13 is an enlarged plan photograph showing the recesses 61a, 61b, and the like formed on the gold plate layer 61 on the terminal 55 and FIG. 14 is an enlarged plan photograph showing a gold plate layer without recesses according to a comparative example.

As is apparent from comparison between FIGS. 13 and 14, the recesses 61a, 61b, and the like may partly expose the surface of the nickel plate layer 67 but not the terminal surface 65a.

Figure 15:
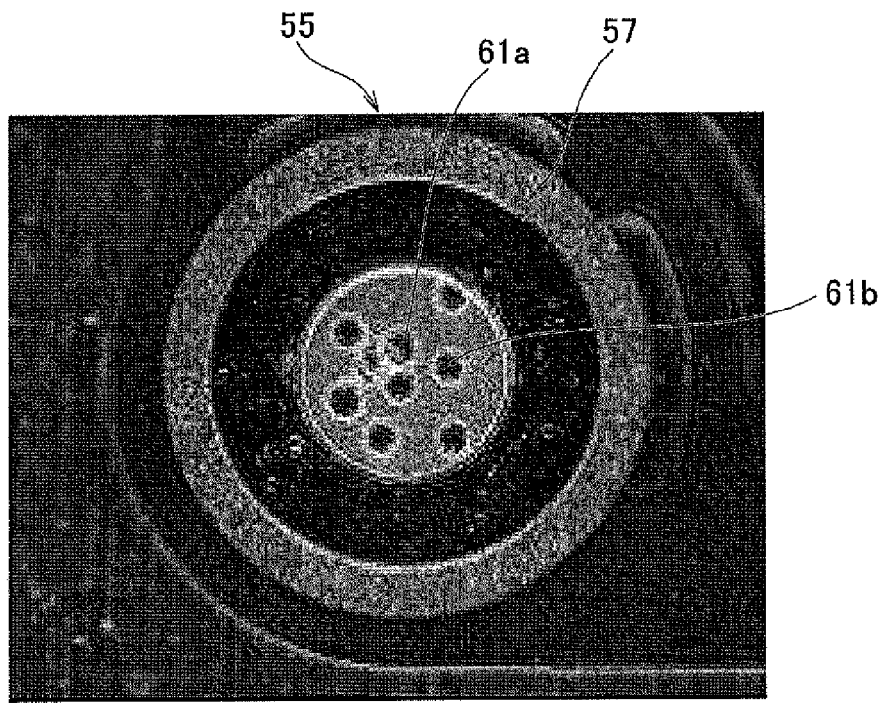
FIG. 15 is an enlarged plan photograph showing the recesses formed on the gold plate layer on the terminal according to the embodiment.
Figure 16:
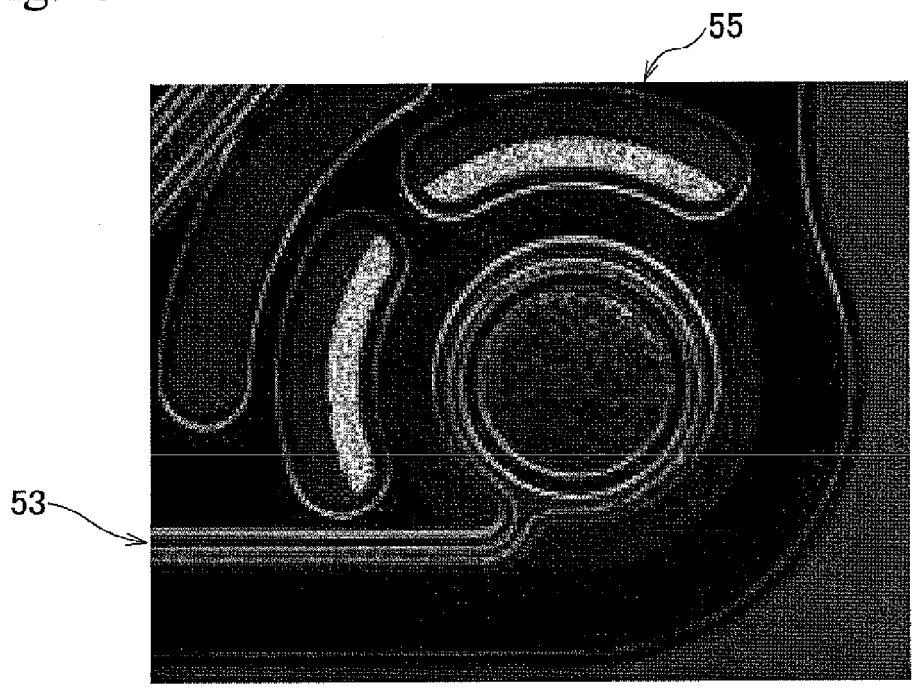
FIG. 16 is an enlarged plan photograph showing a back face of the terminal of FIG. 15.
Figure 17:
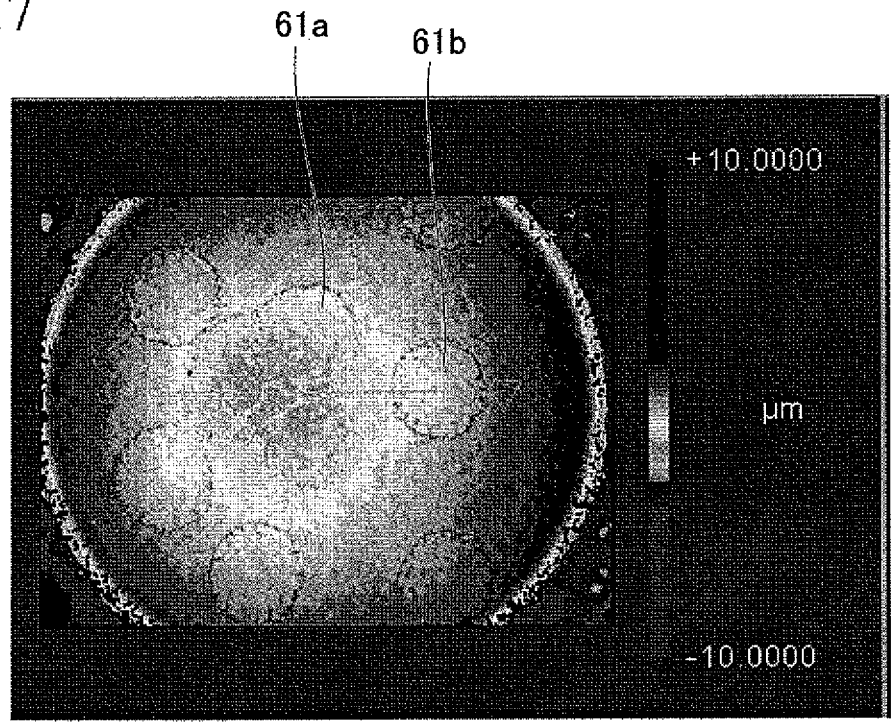
FIG. 17 is an enlarged plan photograph showing the back face of the terminal of FIG. 15.
Figure 18:
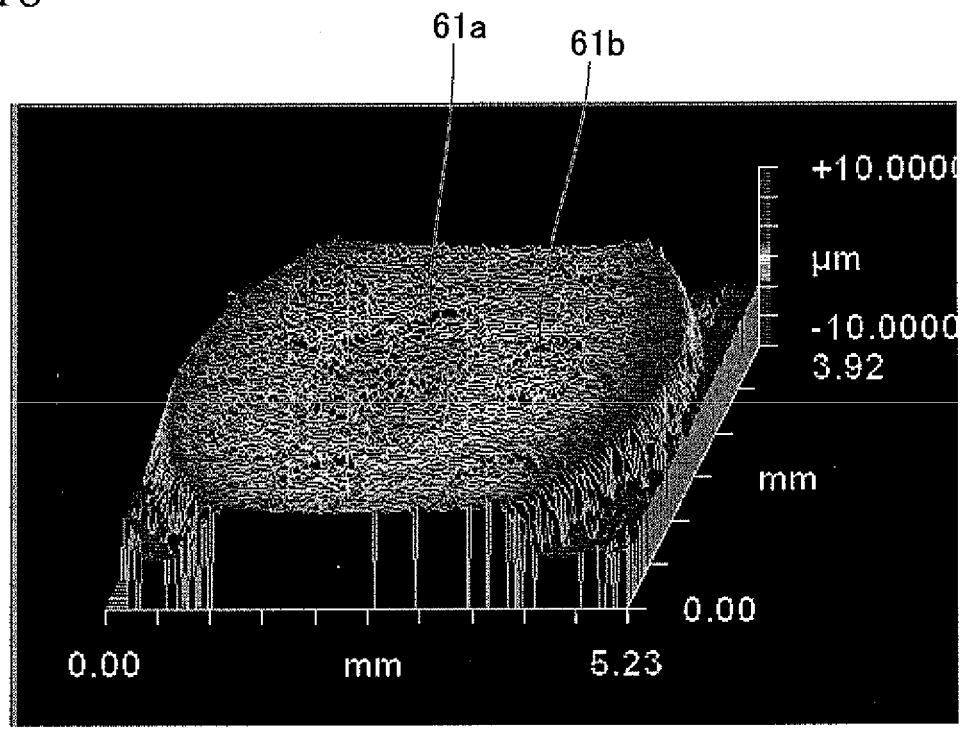
FIG. 18 is an enlarged plan perspective photograph showing the back face of the terminal of FIG. 15.
Figure 19:
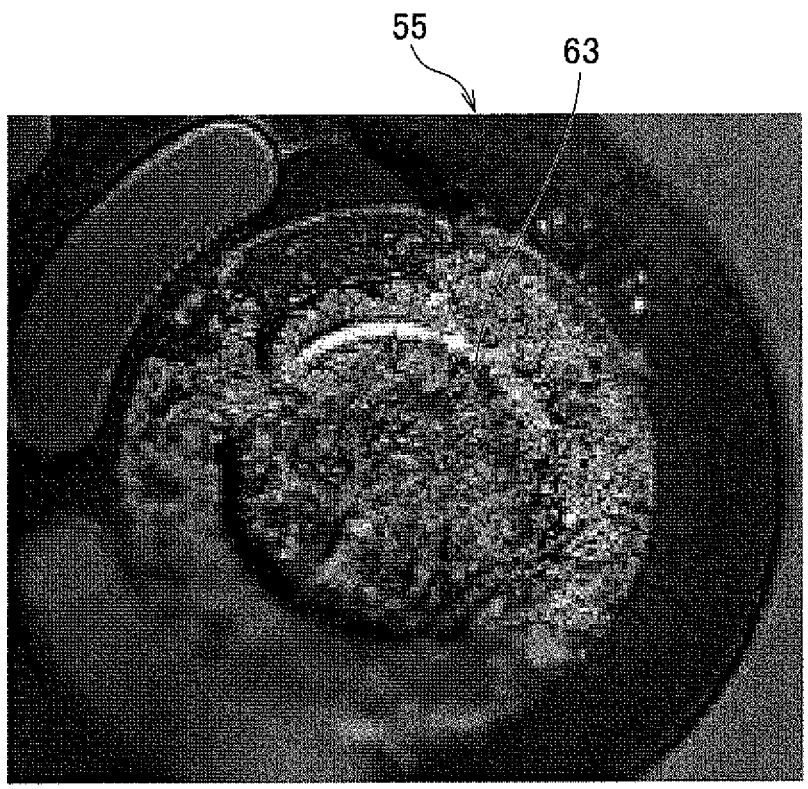
FIG. 19 is an enlarged plan photograph showing a conductive adhesive attaching state of the terminal of FIG. 15 after a peeling test.

FIG. 15 is an enlarged plan photograph showing the recesses 61a, 61b, and the like formed on the gold plate layer 61 on the terminal 55, FIG. 16 is an enlarged plan photograph showing a back face of the terminal 55, FIG. 17 is an enlarged plan photograph showing the back face of the terminal 55, FIG. 18 is an enlarged perspective photograph showing the back face of the terminal 55, and FIG. 19 is an enlarged plan photograph showing a conductive adhesive attaching state of the terminal 55 after a peeling test.

The recesses 61a, 61b, and the like of FIG. 15 formed on the gold plate layer 61 by laser processing substantially give no influence or damage on the terminal 55 as seen in FIGS. 16 to 18. The peeling test (FIG. 19) shows that the conductive adhesive 63 is left on the gold plate layer 61 and ring 57 of the terminal 55.

Figure 20:
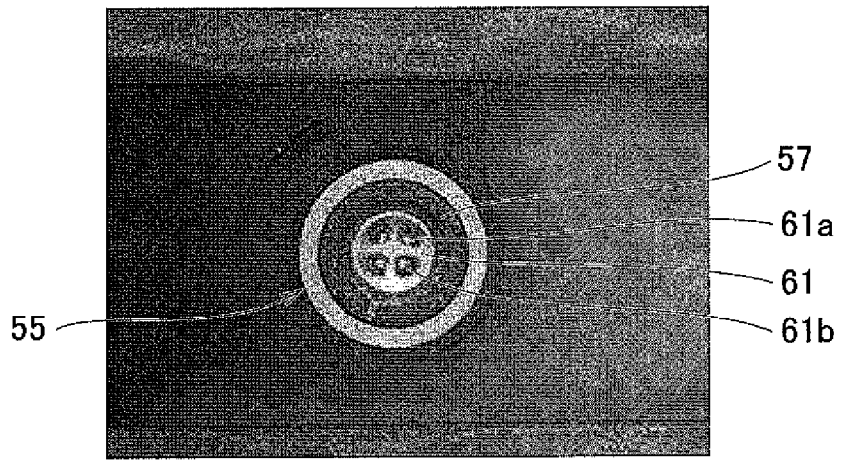
FIG. 20 is an enlarged plan photograph showing recesses formed on a gold plate layer on a terminal by applying a tool to the gold plate layer according to a comparative example.
Figure 21:
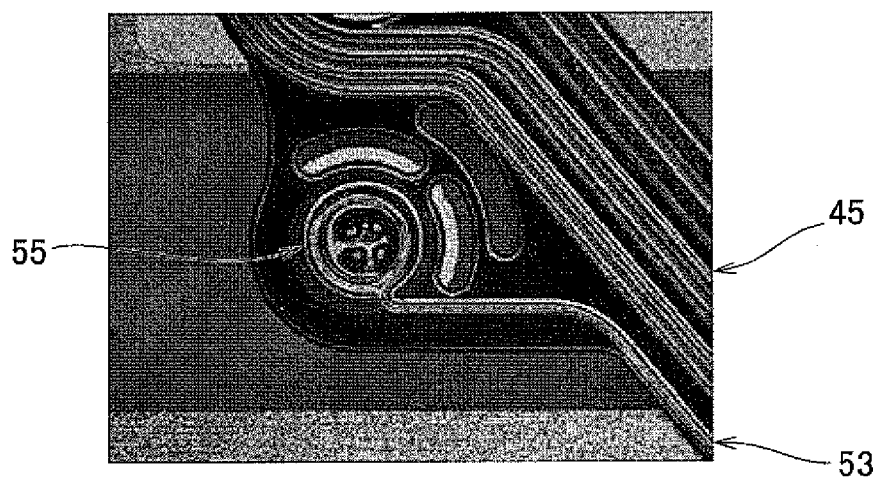
FIG. 21 is a plan photograph showing a back face of the terminal of FIG. 20.
Figure 22:
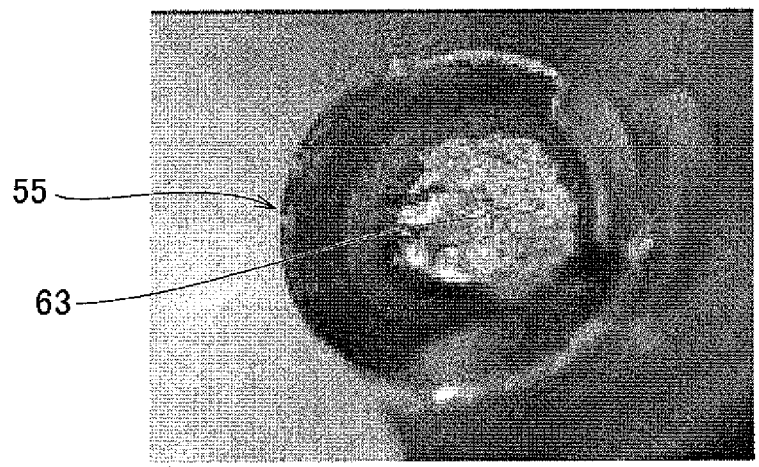
FIG. 22 is an enlarged plan photograph showing a conductive adhesive attaching state of the terminal of FIG. 20 after a peeling test.

FIG. 20 is an enlarged plan photograph showing recesses formed on a gold plate layer on a terminal by applying a tool to the gold plate layer according to a comparative example, FIG. 21 is a plan photograph showing a back face of the terminal of FIG. 20, and FIG. 22 is an enlarged plan photograph showing a conductive adhesive attaching state of the terminal according to the comparative example of FIG. 20 after a peeling test.

As seen in FIG. 20, the recesses 61a, 61b, and the like may be formed on the terminal 55 by pressing with the use of tools. In this case, the conductive adhesive 63 may remain on the surface of the gold plate layer 61 of the terminal 55 as seen in FIG. 22. However, the back face of the terminal 55 is damaged as seen in FIG. 21, to deteriorate electrical characteristics of the terminal 55.

As is apparent from comparison between FIGS. 15 to 19 and FIGS. 20 to 22, the embodiment improves the bonding strength of the terminal 55 without damaging the terminal 55 or deteriorating the electrical characteristics thereof.

Figure 23:
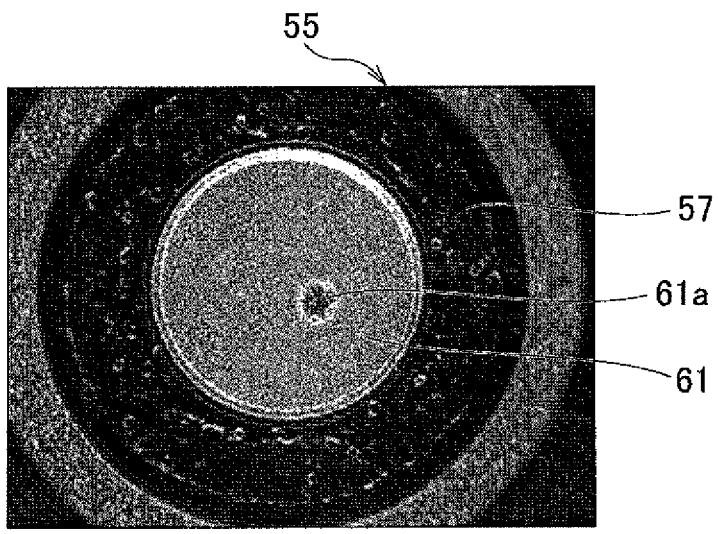
FIG. 23 is an enlarged plan photograph showing a recess formed on a gold plate layer on a terminal according to a variation of the embodiment of the present invention.
Figure 24:
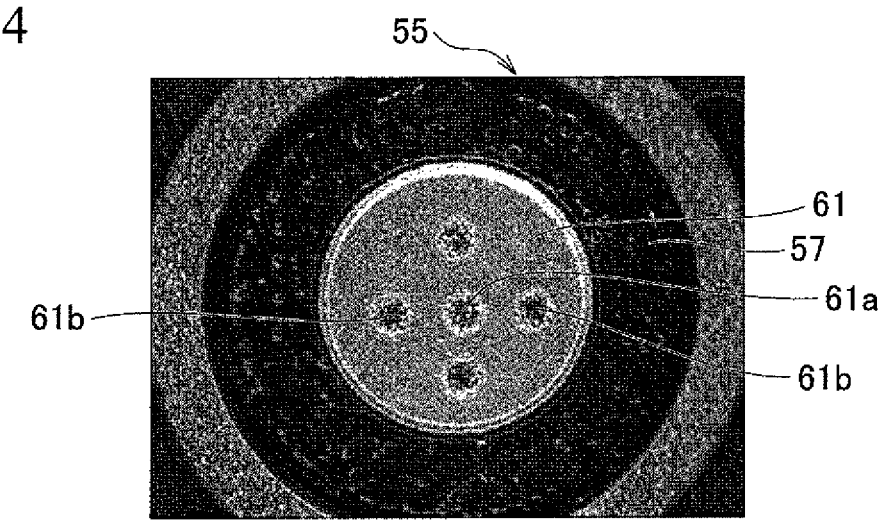
FIG. 24 is an enlarged plan photograph showing recesses formed on a gold plate layer on a terminal according to another variation of the embodiment of the present invention.
Figure 25:
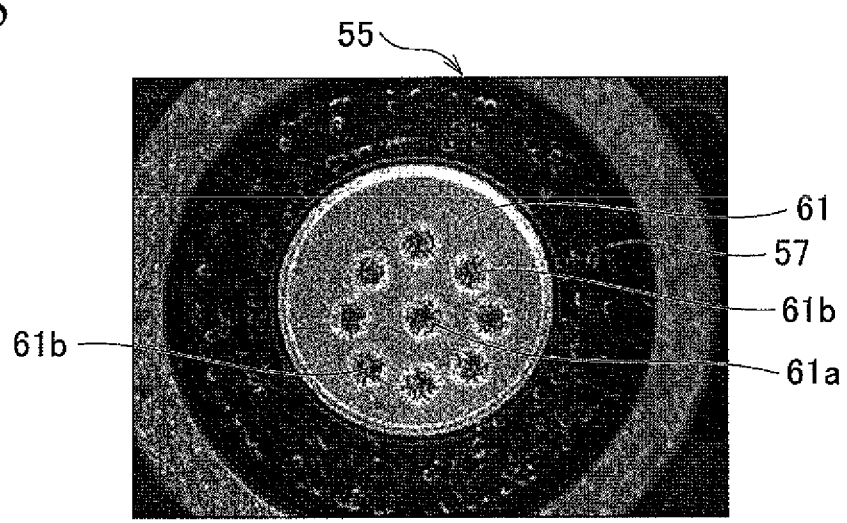
FIG. 25 is an enlarged plan photograph showing recesses formed on a gold plate layer on a terminal according to still another variation of the embodiment of the present invention.
Figure 26:
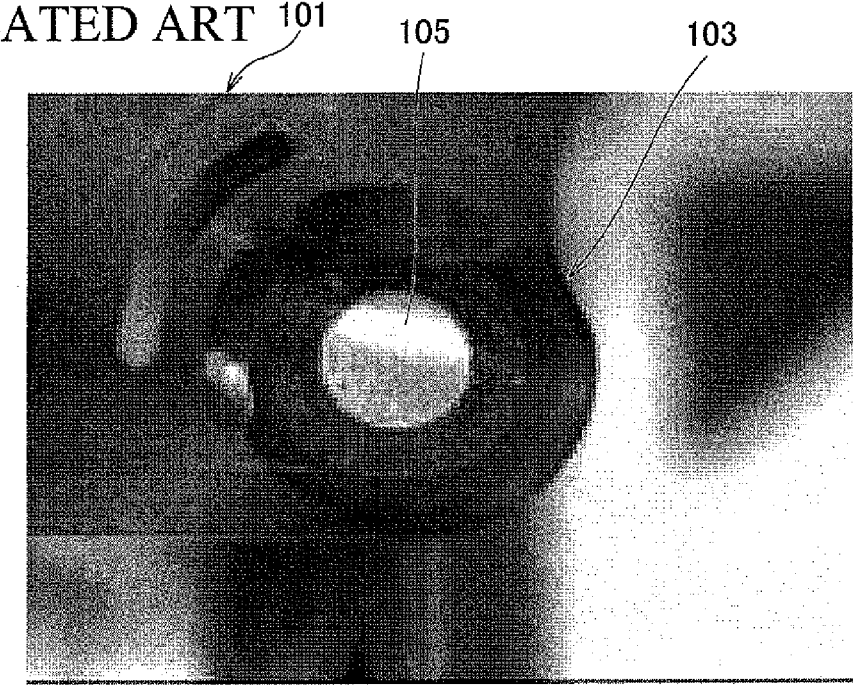
FIG. 26 is an enlarged plan photograph showing a gold plate layer on a terminal surface according to a related art.
Figure 27:
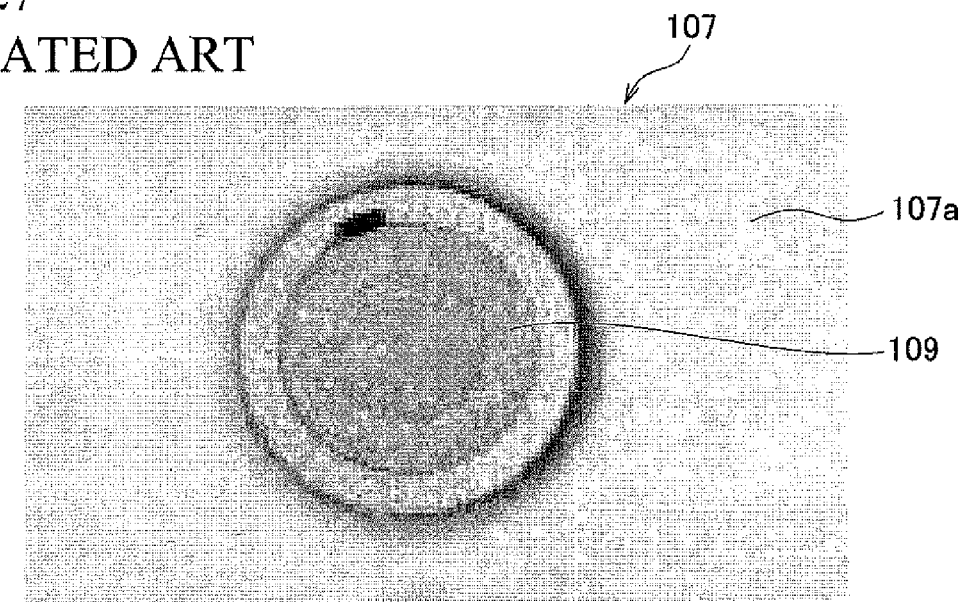
FIG. 27 is an enlarged plan photograph showing a conductive adhesive attaching state of the terminal surface of FIG. 26 after a peeling test.

FIGS. 23 to 25 are enlarged plan photographs showing variations of the above-mentioned embodiment of the present invention.

In FIG. 23, a single recess 61a is formed on the gold plate layer 61 of the terminal 55. In FIG. 24, a recess 61a and four recesses 61b around the recess 61a are formed on the gold plate layer 61 of the terminal 55. In FIG. 25, a recess 61a and eight recesses 61b around the recess 61a are formed on the gold plate layer 61 of the terminal 55.

In each of the variations, the recesses 61a and 61b improve the bonding strength of the terminal 55.

As further variations, the recesses 61a may be omitted or the number of recesses 61a, 61b, and the like may be increased or decreased in FIGS. 24 and 25.

Effects of the electrical connection structure and head suspension according to the embodiment of the present invention and the variations thereof will be explained.

The electrical connection structure connects the piezoelectric element 3 to the flexure 45 as the wiring member with the conductive adhesive 63. The electrical connection structure includes the electrode surface 3a formed on the piezoelectric element 3, and the terminal surface 65a formed on the flexure 45 and being smoother than the electrode surface 3a. The electrical connection structure further includes the gold plate layer 61 as the conductive terminal surface layer formed on the terminal surface 65a and connected to the electrode surface 3a with the conductive adhesive 63, and at least one recess, i.e., one or more recesses 61a, 61b, and the like formed by laser processing on the gold plate layer 61.

The one or more recesses make the surface roughness of the gold plate layer 61 on the copper terminal surface 65a of the terminal 55 closer or equal to that of the gold-plated electrode surface 3a of the piezoelectric element 3, thereby improving a bonding strength on the gold plate layer 61 relative to that on the electrode surface 3a and enhancing the reliability of electrical connection between the electrode surface 3a and the terminal surface 65a.

Since the recesses 61a and the like are on the gold plate layer 61, the terminal surface 65a of the terminal 55 is not affected by the recesses, and therefore, the terminal surface 65a or terminal 55 can maintain its electrical characteristics.

The recesses 61a and the like are formed by laser processing, and therefore, no unintended contamination occurs around the terminal surface 65a or terminal 55 when forming the recesses.

The recesses 61a and the like are formed by laser processing, and therefore, no thermal influence or deformation occurs on the wiring patterns 51 and 53 of the flexure 45.

The recesses 61a and the like are formed without using mechanical tools, and therefore, no mechanical abrasion or contact occurs on or around the terminal 55.

Even if the terminal 55 is very small, laser processing can form the recesses 61a and the like on the gold plate layer 61 of the terminal 55, to help miniaturize the head suspension 1.

Between the terminal surface 65a and the gold plate layer 61, the conductive nickel plate layer 67 is formed as an intermediate layer to prevent corrosion of the terminal surface 65a. Even if the recesses 61a and the like on the gold plate layer 61 expose the nickel plate layer 67, the terminal surface 65a will not be exposed, and therefore, will not corrode.

The flexure 45 has the insulating layer 49, the wiring patterns 51 and 53 formed on the insulating layer 49, and the window 59 formed through the insulating layer 49 at the terminal 55. The window 59 exposes the gold plate layer 61 formed on the terminal surface 65a of the terminal 55 to the electrode surface 3a of the piezoelectric element 3. Around the window 59 opposite to the terminal surface 65a, the ring 57 is formed as a stopper to prevent the conductive adhesive 63, which is liquid when applied, from oozing out of the periphery of the ring 57. As a result, the conductive adhesive 63 stays in the window 59 and in the space between the ring 57 and the electrode surface 3a.

The ring 57 improves bonding strength between the piezoelectric element 3 and the terminal 55. The recesses 61a and the like on the gold plate layer 61 and the ring 57 cooperate to synergistically improve the bonding strength between the terminal 55 and the electrode surface 3a.

The head suspension 1 employs the piezoelectric element 3 to which the electrical connection structure of the present invention is applied. The head suspension 1 has the base 5, the load beam 7 connected to the base 5, and the read-write head 9 attached to the front end of the load beam 7. The piezoelectric element 3 is arranged between the base 5 and the load beam 7 and is configured to deform in proportion to a voltage applied thereto, to minutely move the read-write head 9 through the load beam 7 in a sway direction relative to the base 5.

With the electrical connection structure improving the reliability of electrical connection between the piezoelectric element 3 and the terminal 55 of the flexure 45, the head suspension 1 can accurately and reliably conduct a positioning operation of the read-write head 9. Namely, with the dual actuator system involving the voice coil motor and the piezoelectric element 3 of the electrical connection structure, the head suspension 1 can precisely position the read-write head 9 to a target position on a magnetic disk.

The recesses 61a and the like on the gold plate layer 61 may be formed with the use of a laser marker. The laser marker with properly adjusted laser power is capable of speedily forming the recesses 61a and the like on the gold plate layer 61.

The laser marker can form various shapes of recesses only by changing font data.

The terminal surface 65a of the terminal 55 may be made of copper or any other conductive material.

The conductive terminal surface layer (gold plate layer) 61 on the terminal surface 65a of the terminal 55 may be made of gold or any other conductive material.

The intermediate layer 67 on the terminal surface 65a of the terminal 55 may be made of nickel or any other conductive material. The intermediate layer 67 may be omitted and the conductive terminal surface layer 61 may be directly formed on the terminal surface 65a.

What is claimed is:

1. An electrical connection structure for connecting a piezoelectric element and a wiring member to each other with a conductive adhesive, the electrical connection structure comprising:
   an elecrode surface formed on the piezoelectric element;
   a terminal surface formed on the wiring member;
   a conductive terminal surface layer formed on the terminal surface and connected to the electrode surface with the conductive adhesive;
   a conductive intermediate layer comprising nickel that is therethroughout formed between the terminal surface and the conductive terminal surface layer; and
   at least one recess formed by laser processing on the conductive terminal surface layer in which the at least one recess extends through the conductive terminal surface layer so as to expose one or more portions of the conductive intermediate layer therethroughout to the conductive adhesive without exposing the terminal surface to the conductive adhesive.

2. The electrical connection structure of claim 1, wherein the terminal surface is made of copper, and
   the conductive terminal surface layer is formed by plating gold on the terminal surface.

3. The electrical connection structure of claim 1, wherein:
   the conductive intermediate layer between the terminal surface and the conductive terminal surface layer is provided to prevent the terminal surface from corroding.

4. The electrical connection structure of claim 1, wherein the wiring member includes an insulating layer and wires formed on the insulating layer,
   a window is formed through the insulating layer to expose the conductive terminal surface layer on the terminal surface to the electrode surface of the piezoelectric element,
   a stopper is formed around the window on a surface of the insulating layer opposite to the conductive terminal surface layer, to prevent the conductive adhesive, which is liquid when applied, from oozing, and
   the conductive adhesive is present in the window space between the stopper and the electrode surface of the piezoelectric element.

5. A head suspension having a piezoelectric element to which the electrical connection structure of claim 1 is applied, comprising:
   a base and a load beam connected to the base;
   a read-write head attached to the load beam; and
   the piezoelectric element being arranged between the base and the load beam and being configured to deform in proportion to a voltage applied thereto, to minutely move the read-write head through the load beam in a sway direction relative to the base.

6. An electrical connection structure for connecting a piezoelectric element and a wiring member to each other with a conductive adhesive, the electrical connection structure comprising:
   an electrode surface formed on the piezoelectric element;
   a terminal surface formed on the wiring member;
   a conductive terminal surface layer formed on the terminal surface and connected to the electrode surface with the conductive adhesive;
   a conductive intermediate layer comprising nickel therethroughout that is formed between the terminal surface and the conductive terminal surface layer; and
   at least one recess formed by laser processing on the conductive terminal surface layer in which the at least one recess extends through the conductive terminal surface layer so as to expose one or more portions of the conductive intermediate layer therethroughout to the conductive adhesive without exposing the terminal surface to the conductive adhesive, said exposure of the conductive intermediate layer effecting a bonding strength of the terminal and terminal surface layer to the conductive adhesive that is substantially equal to a bonding strength between the electrode surface of the piezoelectric element and the conductive adhesive.

\* \* \* \* \*